(12) United States Patent
Bergler et al.

(10) Patent No.: US 11,378,590 B2
(45) Date of Patent: Jul. 5, 2022

(54) DEVICE AND METHOD FOR PROCESSING A MULTIPLICITY OF SEMICONDUCTOR CHIPS

(71) Applicant: OSRAM Opto Semiconductors GmbH, Regensburg (DE)

(72) Inventors: Michael Bergler, Etzenricht (DE); Roland Zeisel, Tegernheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/282,622

(22) PCT Filed: Oct. 1, 2019

(86) PCT No.: PCT/EP2019/076626
§ 371 (c)(1),
(2) Date: Apr. 2, 2021

(87) PCT Pub. No.: WO2020/070148
PCT Pub. Date: Apr. 9, 2020

(65) Prior Publication Data
US 2021/0356496 A1 Nov. 18, 2021

(30) Foreign Application Priority Data
Oct. 4, 2018 (DE) ...................... 10 2018 124 492.4

(51) Int. Cl.
*G01R 1/04* (2006.01)
*G01R 1/067* (2006.01)
(Continued)

(52) U.S. Cl.
CPC ....... *G01R 1/0735* (2013.01); *G01R 31/2601* (2013.01)

(58) Field of Classification Search
CPC .......... G01R 1/04; G01R 1/067; G01R 1/073; G01R 31/02; G01R 31/26
See application file for complete search history.

(56) References Cited

U.S. PATENT DOCUMENTS

| | | | | |
|---|---|---|---|---|
| 5,672,977 A | * | 9/1997 | Yamada | G01R 1/0735 324/754.14 |
| 2002/0003428 A1 | | 1/2002 | Freund et al. | |

(Continued)

FOREIGN PATENT DOCUMENTS

| | | |
|---|---|---|
| CN | 106124958 A | 11/2016 |
| CN | 106569149 A | 4/2017 |

(Continued)

OTHER PUBLICATIONS

International Search Report issued for corresponding International Patent Application No. PCT/EP2019/076626 dated Jan. 24, 2020, along with an English translation.

(Continued)

*Primary Examiner* — Neel D Shah
(74) *Attorney, Agent, or Firm* — Hauptman Ham, LLP

(57) ABSTRACT

A device for processing a multiplicity of semiconductor chips in a wafer assemblage includes an electrically conductive carrier for contacting rear contacts of the semiconductor chips, an electrically conductive film for contacting front contacts of the semiconductor chips that are situated opposite the rear contacts, and a squeegee, which is displaceable relative to the film and is configured to press a region of the film in the direction toward the carrier.

15 Claims, 3 Drawing Sheets

Figure 1:
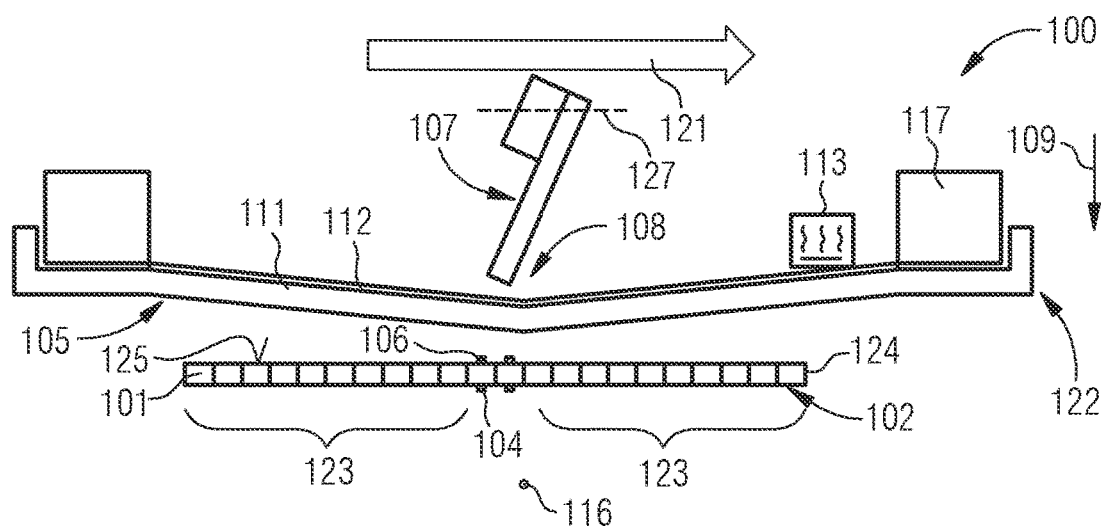

(51) Int. Cl.
    *G01R 1/073*     (2006.01)
    *G01R 31/26*     (2020.01)

(56) References Cited

U.S. PATENT DOCUMENTS

| | | |
|---|---|---|
| 2013/0015859 A1 | 1/2013 | Tseng et al. |
| 2018/0096980 A1* | 4/2018 | Asahi ................ H01L 24/73 |
| 2018/0156864 A1 | 6/2018 | Curry et al. |

FOREIGN PATENT DOCUMENTS

| | | |
|---|---|---|
| DE | 10 2016 114 459 A1 | 2/2018 |
| JP | 2009-128188 A | 6/2009 |
| JP | 2009-128189 A | 6/2009 |
| JP | 2016-11862 A | 1/2016 |
| KR | 10-2015-0006955 A | 1/2015 |
| WO | 2015/036368 A1 | 3/2015 |

OTHER PUBLICATIONS

Written Opinion issued for corresponding International Patent Application No. PCT/EP2019/076626 dated Jan. 24, 2020.

\* cited by examiner

DEVICE AND METHOD FOR PROCESSING A MULTIPLICITY OF SEMICONDUCTOR CHIPS

CROSS REFERENCE TO RELATED APPLICATION

This application is a National Stage of International Application No. PCT/EP2019/076626, filed on Oct. 1, 2019, which designates the United States and was published in Europe, and which claims priority to German Patent Application No. 10 2018 124 492.4, filed on Oct. 4, 2018, in the German Patent Office. Both of the aforementioned applications are hereby incorporated by reference in their entireties.

An device for processing a plurality of semiconductor chips in a wafer assemblage is described. Furthermore, a method for processing a plurality of semiconductor chips in a wafer assemblage is described.

According to at least one embodiment, the device comprises an electrically conductive carrier for contacting rear contacts of the semiconductor chips.

The semiconductor chips may be, for example, optoelectronic semiconductor chips such as light-emitting diodes. Optical sensors are also possible. Furthermore, other electronic components manufactured in the wafer assemblage, such as ESD protection diodes, are also possible. The semiconductor chips in the wafer assemblage are separated after processing, for example.

In operation, the carrier is used to make electrical contact with the rear contacts of the semiconductor chips. For example, the carrier is a so-called chuck, for example a metal chuck. The carrier comprises in particular an electrically conductive layer or wiring by means of which the rear contacts of the semiconductor chips can be supplied with an electrical voltage and/or an electrical current. In particular, the carrier is designed to set the rear contact of the semiconductor chips to a reference potential. Through the carrier, the rear contacts of the semiconductor chips are coupled, for example, in parallel with the reference potential, for example with a ground potential. The carrier is further designed to hold and support the wafer assemblage.

According to at least one embodiment, the device comprises an electrically conductive film. The electrically conductive film is designed for contacting front contacts of the semiconductor chips. The front contacts are opposite to the rear contacts. The electrically conductive film is, for example, a multilayer film or a film comprising a single layer. At least one of the layers of the film is electrically conductive, in particular the layer facing the carrier. In the ready-to-use state, the film extends along the carrier at a distance from the carrier. When a wafer assemblage is inserted in the carrier, the film is initially spaced from the wafer assemblage.

The semiconductor chips each comprise at least a rear contact and a front contact. These are arranged as opposite sides to each other. For example, in the case of light-emitting diodes, the semiconductor chips emit electromagnetic radiation during operation when a voltage is applied to the rear contact and to the front contact.

According to one embodiment, the device comprises a doctor blade. The doctor blade is displaceable relative to the film. The doctor blade is designed to press a region of the film in the direction of the carrier. In operation, it is thus possible to use the doctor blade to press the film in the region against the front contacts of the semiconductor chips.

Outside the area, the film remains spaced from the front contacts. Thus, only a part of the semiconductor chips of the wafer assemblage can be contacted both at the back contacts and at the front contacts. By means of the film and the electrically conductive carrier, it is possible to apply a voltage in the area between the film and the carrier and thus between the front contacts and the rear contacts in the area. Depending on the individual structure of the semiconductor chips in the area and the resulting electrical parameters, such as the conductivity of the semiconductor chips, a locally different current flow is then established between the carrier and the film.

The locally different current flow becomes, for example, a targeted damage of individual semiconductor chips and/or enables a radiation-emitting operation of individual semiconductor chips. In particular, the damage occurs selectively when, for example, a voltage is selected that poles the diode-type semiconductor chips in the reverse direction. Thus, a lot of current will flow through semiconductor chips which have an atypical characteristic curve and thus a low reverse voltage. The applied voltage is selected in such a way that so much power is dissipated at the atypical semiconductor chips that they are destroyed.

The targeted damage of individual semiconductor chips can be used, for example, to identify semiconductor chips whose parameters lie outside a predefined range. The parameter is, for example, a reverse load. The doctor blade is an elongated element similar to a doctor blade used in screen printing. In particular, the doctor blade is significantly more elongated along its longitudinal direction than across its longitudinal direction. In particular, the doctor blade is extended along one spatial direction significantly longer than along the other two spatial directions. The area of the doctor blade for contacting the film extends linearly along the longitudinal direction, for example. One edge of the doctor blade is used for contacting the film, for example. Along the longitudinal direction, for example, the doctor blade has an extension corresponding to a plurality of semiconductor chips, for example, more than 10 semiconductor chips or more than 100 semiconductor chips. Transversely to the longitudinal direction, the doctor blade comprises, for example, an extension corresponding to only a few semiconductor chips, for example, a single semiconductor chip, two semiconductor chips, or less than five semiconductor chips. The doctor blade comprises, for example, a shape comparable to a knife, a spatula or a razor blade. The doctor blade is, for example, made of a metal or a plastic or a combination of different materials. The doctor blade is flexible, particularly in the area where it contacts the film during operation. By means of the doctor blade, a compressive force can be exerted on the film in the region, so that the film in the region can be pressed in the direction of the carrier.

According to one embodiment, a device for processing a plurality of semiconductor chips in a wafer assemblage comprises an electrically conductive carrier for contacting rear contacts of the semiconductor chips. The device comprises an electrically conductive film for contacting front contacts of the semiconductor chips. The front contacts are opposite to the rear contacts. The device comprises a doctor blade that is displaceable relative to the film. The doctor blade is designed to press a portion of the film toward the carrier.

By means of the device it is possible, for example, to find semiconductor chips in the wafer assemblage which do not withstand a certain reverse stress, so-called reverse-weak semiconductor chips or Ubr-weak semiconductor chips. By means of the carrier and the film, it is possible to selectively apply a voltage to the semiconductor chips of the wafer for a certain time.

The device is based on the consideration that known methods are time-consuming, in which, for example, each semiconductor chip of the wafer is contacted sequentially with a measuring needle. In the case of full-area contacting of the wafer assemblage both at the rear contacts and at the front contacts, very high currents of up to 1 kA usually flow for about 1 million chips on a 6" wafer assemblage. For example, a current of 1 mA per chip. In addition, it must always be ensured that all semiconductor chips of the wafer assemblage are contacted in the area.

The device described here now makes use of the idea that the semiconductor chips in the wafer assemblage are no longer contacted over the entire area, but in particular in a linear manner. The necessary electrical voltage is applied between the doctor blade with the film and the carrier. Thus, at one point in time, a contact line is created on which all semiconductor chips along this contact line are loaded with the applied voltage. The semiconductor chips outside this contact line are in particular not loaded with the applied voltage. The entire wafer assemblage is processed by moving the doctor blade over the wafer assemblage, thus moving the contact line over the entire wafer assemblage. Local unevenness, such as particles on the wafer assemblage, is compensated for by the flexibility and elasticity of the doctor blade and the film.

This enables simple and reliable electrical contacting of the semiconductor chips to be processed, especially since contact is always made only along the contact line. Due to the linear contacting, less current flows during operation than with full-surface contacting. For example, with 1250 chips along a contact line that is, say, 150 mm long, 1 mA of current flows per chip, resulting in a total current of 1.2 A. The current flowing during operation is thus lower by a factor of 1000, for example, than in conventional devices in which the wafer assemblage is electrically contacted over its entire surface on both sides.

According to one embodiment, the device comprises an electrical voltage source. The electrical voltage source is electrically connected to the carrier. The electrical voltage source is electrically connected to the doctor blade and/or the film. By means of the voltage source, it is possible to apply an electric current/voltage between the carrier and the doctor blade and/or the film. In particular, it is possible that the doctor blade is used both as a current line and as a pressurizing medium for applying a pressure to the film. Alternatively or additionally, it is possible that the film is used directly as a current line. By means of the doctor blade, the film, which is directly connected to the electrical power source, is pressed against the wafer assemblage.

According to one embodiment, the film comprises an electrically conductive polymer film. Thus, a sufficiently flexible and elastic film is formed, which thereby enables a sufficient and defined electrical current flow. In particular, the polymer film has a precisely defined predetermined electrical resistance. According to exemplary embodiments, the electrically conductive film comprises the electrically conductive polymer film. The polymer film may also have a multilayer structure.

According to one embodiment, the film comprises an electrically conductive metal layer. For example, the electrically conductive film comprises a plastic layer made of a polymer, an elastomer or a rubber. In addition, the electrically conductive metal layer is provided, which in particular provides for the electrical conductivity of the film. The metal layer is constructed, for example, in the manner of a mesh, sieve or grid in order to be sufficiently elastic and flexible.

According to one embodiment, the film is coupled to a heater to heat the film. For example, the metal layer is used for this purpose, which is suitable for distributing the heat over the film. By means of the heater for the film, it is possible, for example, to adjust the modulus of elasticity of the film to a desired value so that the topology of the semiconductor chips is well overmolded and the semiconductor chips are reliably contacted in the area. Alternatively or additionally, the carrier comprises a heater to heat the carrier. This also serves to adjust properties such as the modulus of elasticity to enable reliable contacting.

According to one embodiment, the doctor blade is a comb doctor blade. The comb doctor blade comprises a plurality of prongs. The prongs are formed, for example, from a steel sheet that is slotted at small intervals, for example 100 μm. Thus, the prongs are formed. The tines are useful for reliably compensating for local unevenness. The width of the prongs is, for example, in the range of a grid of the semiconductor chips. The width of the slots between the prongs is, for example, smaller than the grid of the semiconductor chips in the wafer assemblage.

According to one embodiment, the doctor blade is rotatably mounted relative to the carrier about a main axis of the doctor blade. Thus, it is possible for the doctor blade to horizontally sweep the wafer assemblage in operation to sequentially sweep all semiconductor chips of the wafer assemblage. In this case, rotation is possible in order to enable the doctor blade to exert a pressure as constant as possible on the wafer assemblage. For example, a skewed position of the wafer assemblage in the carrier can be compensated. In particular, automatic wedge error compensation is possible. For example, the rag is rotatably mounted about two main axes. The two main axes are in particular transverse to each other.

According to one embodiment, the doctor blade is designed to contact the semiconductor chips along a line by means of the film, wherein the semiconductor chips outside the line are unpowered. Thus, a reliable processing of the semiconductor chips is possible, in which the flowing electrical currents can be kept below predetermined limit values.

According to one embodiment, the carrier comprises a frame that is adapted to an outer contour of the wafer assemblage. The frame comprises the same height as the wafer assemblage. The frame serves to absorb compressive forces of the doctor blade outside the wafer assemblage. For example, in the case of a circular outer contour of the wafer assemblage, the pressure of the doctor blades on the wafer assemblage is thus the same within predetermined tolerances along the wafer assemblage.

According to one embodiment, a method for processing a plurality of semiconductor chips comprises electrically contacting rear contacts of the semiconductor chips. A region of an electrically conductive film is pressed against a portion of front contacts of the semiconductor chips. The leading edges are opposite to the rear contacts. By means of pressing the area of the film against the part of the front contacts, the part of the front contacts is electrically contacted. The area of the film is displaced.

In particular, the method is carried out by means of a described device according to at least one embodiment.

The advantages and further embodiments described in connection with the device also apply to the method and vice versa.

According to at least one embodiment, an electrical voltage is applied to the film. For example, the electrical film is directly connected to an electrical voltage source for this purpose. Thus, a reliable and sufficiently well-defined current flow is possible.

According to at least one embodiment, the film is heated. This enables good overmolding of the semiconductor chips in the wafer assemblage and thus reliable contacting of the semiconductor chips at the front contacts.

According to one embodiment, the area of the film is pressed against the part of the front contacts by means of a doctor blade. Thus, a simple and reliable contacting of the front contacts of the semiconductor chips is possible and, at the same time, the displacement of the area can be easily realized. In particular, the area of the film is displaced by moving the doctor blade relative to the film and the wafer assemblage.

According to one embodiment, the doctor blade is rotated relative to a horizontal in response to an orientation of the wafer assemblage. In particular, a rotation about two main axes of the doctor blade, which are perpendicular to each other, is possible. This makes it possible, for example, to compensate for a skewed position of the wafer assemblage, in particular a so-called automatic wedge error compensation. The wedge error compensation is also realized by the flexibility of the doctor blade.

Further advantages, features and further embodiments result from the following exemplary embodiments explained in connection with the figures. Identical, similar or similarly acting elements are provided with the same reference signs in the figures. The figures and the proportions of the elements shown in the figures are not to be regarded as to scale.

Figure 2:
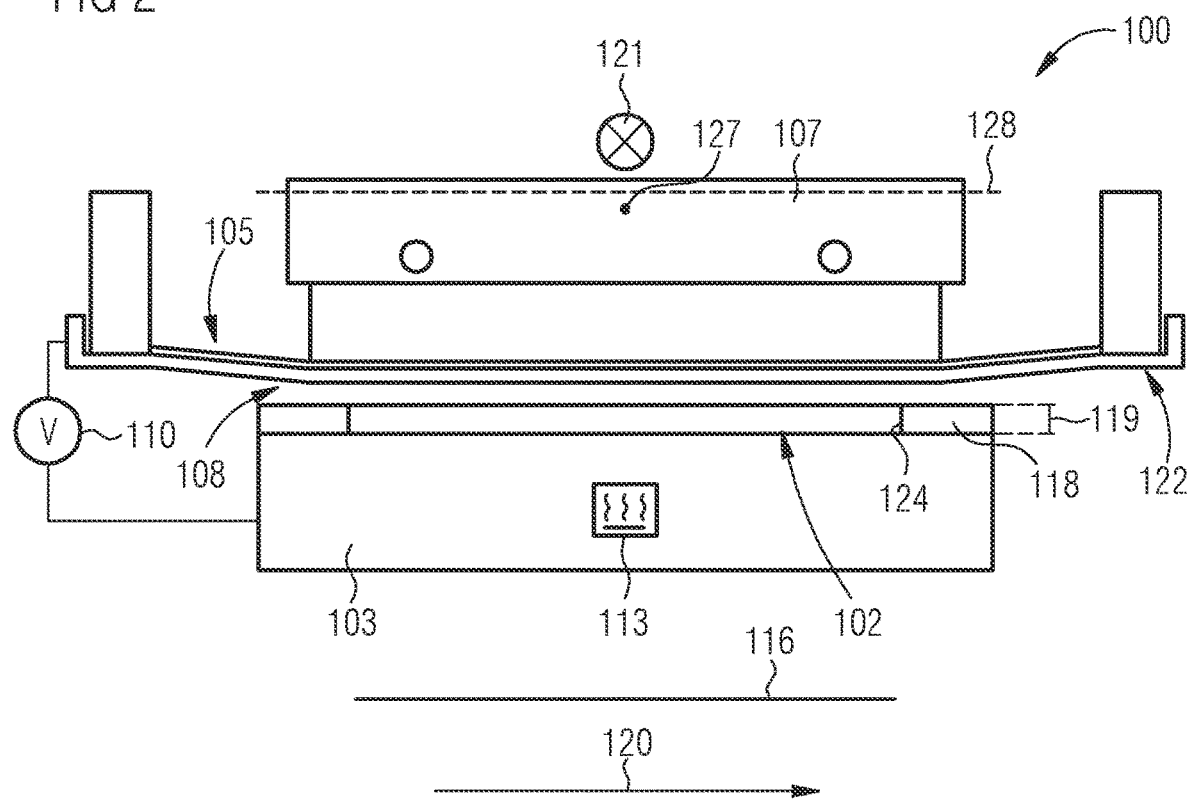
Figure 3:
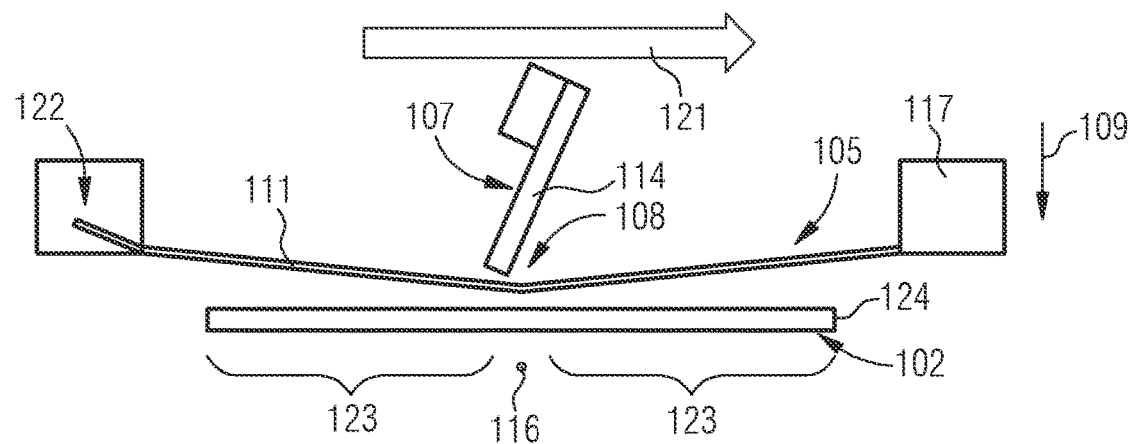
Figure 4:
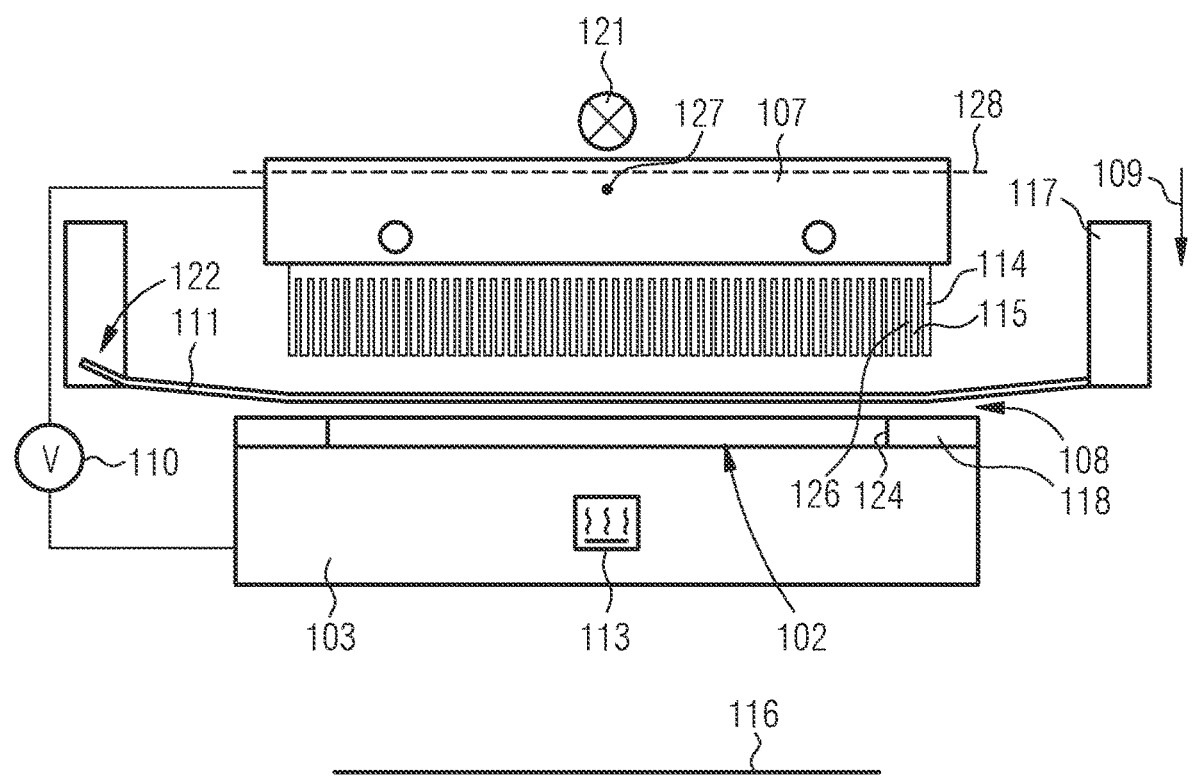
Figure 5:
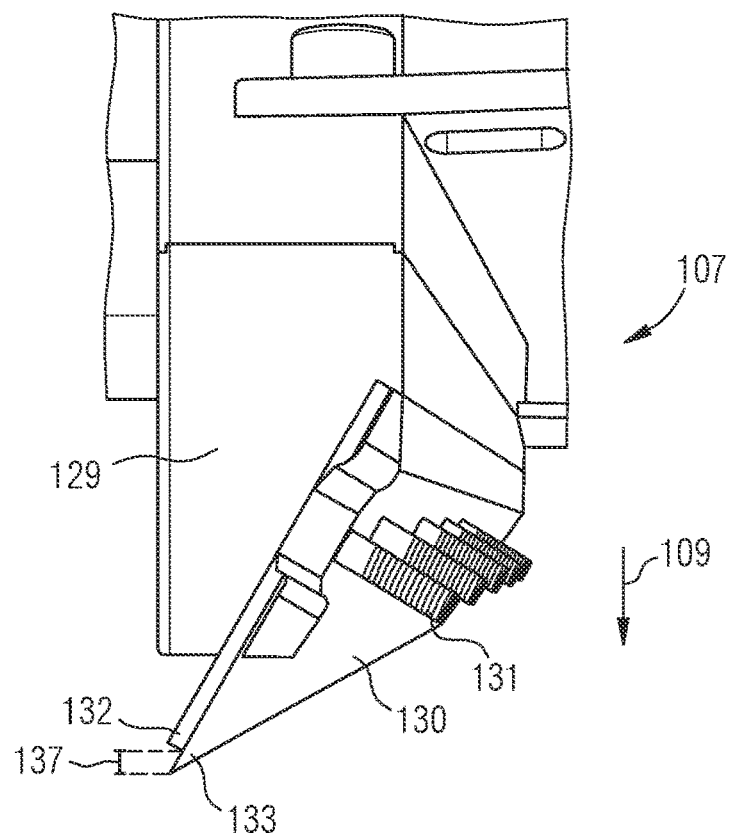
Figure 6:
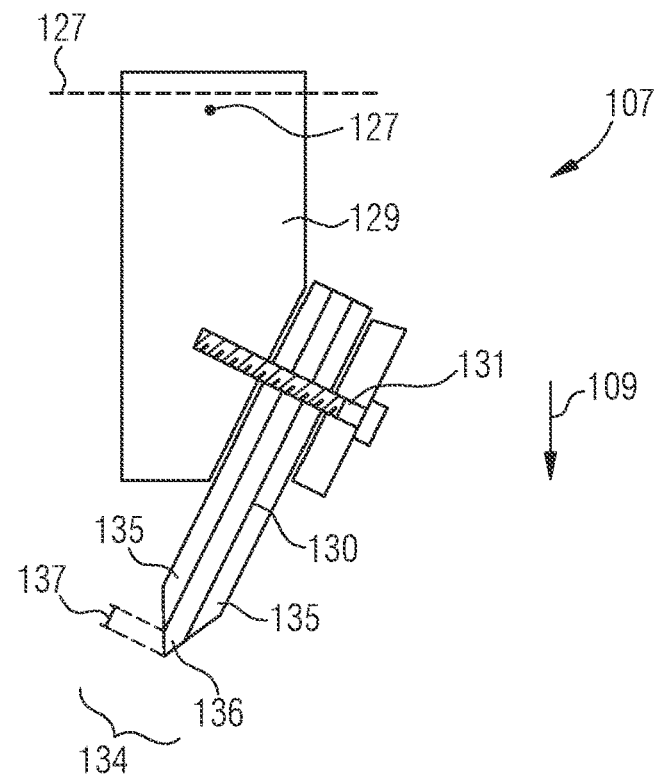

It shows:

FIG. 1 a schematic representation of a device and a wafer assemblage according to an exemplary embodiment, FIG. 2 a further schematic representation of the device according to FIG. 1, FIG. 3 a schematic representation of a device and a wafer assemblage according to an exemplary embodiment, FIG. 4 a further schematic representation of the device according to FIG. 3, FIG. 5 a schematic representation of a doctor blade according to an exemplary embodiment, and FIG. 6 a schematic representation of a doctor blade according to an exemplary embodiment.

FIG. 1 shows a device 100 for processing a plurality of semiconductor chips 101 in a wafer assemblage 102. The wafer assemblage 102 to be processed is arranged on a carrier 103 (FIGS. 2 and 4), for example a metal chuck. Rear contacts 104 of the semiconductor chips 101 are in contact with the carrier 103 and electrically contactable by means of the carrier 103. The processing includes, for example, testing and/or measuring and/or categorizing the semiconductor chips 101.

The device 100 comprises an electrically conductive film 105. The film 105 comprises an electrically conductive polymer film 111, also referred to as a resistive film. In addition, the film 105 comprises a metal layer 102. The metal layer is formed, for example, in the manner of a grid, sieve, or mesh. The polymer film 111 and the metal layer 102 are bonded together.

The film 105 is held spaced apart from the wafer assemblage 102 by means of a tensioning frame 117. For example, the tensioning frame 117 comprises a tensioning device 122 that applies a predetermined tension to the film 105.

As shown in FIG. 2, the film 105 is connected to a voltage source 110. In addition, the carrier 103 is connected to the voltage source 110.

The film 105 serves for electrical contacting of a part of the semiconductor chips 101 of the wafer assemblage 102 simultaneously. Sequentially, all semiconductor chips 101 of the wafer assemblage 102 can be contacted by means of the film 105. In a region 108 where the film 105 contacts front contacts 106 of the semiconductor chips 101, a current flows through these semiconductor chips 101. The film 105 thus serves as a contacting means for applying an electric voltage to a plurality of the semiconductor chips 101, wherein another part of the semiconductor chips 101 remains unpowered.

A doctor blade 107 is provided for pressing the film 105 against the front contacts 106. The doctor blade 107 is designed to press the film 105 against the wafer assemblage 102 along a direction 109. In the region 108 where the doctor blade 107 presses the film 105 against the semiconductor chips 101, an electric current can flow. Outside the region 108, the film 105 is further arranged spaced apart from the wafer assemblage 102 so that the unpowered regions 123 are formed. In these regions, the front contacts 106 of the semiconductor chips 101 are not in contact with the film 105, and thus no current flows through these semiconductor chips 101. The doctor blade 107 is moved along a displacement direction 121 relative to the film 105 and relative to the wafer assemblage 102 and the carrier 103. Thus, the area 108 is displaced along the displacement direction 121. As a result, all of the semiconductor chips 101 of the wafer assemblage 102 are gradually brought into contact with the film 105.

According to the exemplary embodiment, the film 105 is connected to a heater 113. The heater 113 is used for defined heating of the film 105. According to further exemplary embodiments, the heater 113 is not used for the film 105.

As shown in FIG. 2, it is possible that the carrier 103 is connected to the heater 113. Thus, the carrier 103 can be heated to a predetermined temperature. According to further exemplary embodiments, the heater 113 for the carrier 103 is omitted. The heater 113 for the film 105 and/or the carrier 103 is used to heat the carrier 103 and/or the film 105, for example the metal layer 112 of the film 105. Thus, for example, the modulus of elasticity of the film 105 can be adjusted by means of the temperature in order to be able to sufficiently overmold the topology of the semiconductor chips 101 in the wafer assemblage 102 and thus to be able to make reliable electrical contact with the front contacts 106.

By means of pressing the film 105 by means of the doctor blade 107, the front side of the wafer assemblage 102 facing the film 105, at which the front contacts 106 are arranged, is not contacted over the entire surface, but in a linear manner. In particular, the film 105 contacts the front contacts 106 along a line 116, contacting, for example, a single row of the semiconductor chips 101 or more than one row, for example two, three or up to ten rows. However, not all of the front contacts 106 are contacted simultaneously. For example, a thin metal film bonded to the polymer film 111 is used as the metal layer 112. According to further exemplary embodiments, the polymer film 111 is omitted, so that only the metal layer 112 is provided. The film 105, and in particular the polymer film 111, also serves to limit the flow of current in the event of a short circuit, for example in the case of a defective semiconductor chip 101.

By means of pressing the film 105 in the region 108, a contact line is formed along the line 116, on which all semiconductor chips 101 along this contact line are loaded with the applied voltage of the voltage source 110.

The entire wafer assemblage 102 is processed by moving the doctor blade 107 along the displacement direction 121 over the wafer assemblage 102. As a result, the line 116 shifts along the wafer assemblage 102 and thus the contact line also shifts. The area 108 in which the contact line is formed is moved over the entire wafer assemblage 102. The displacement direction 121 is substantially parallel to a surface 125 of the wafer assemblage 102 facing the film 105.

The doctor blade 107 according to the exemplary embodiment of FIG. 102 is, for example, a plastic doctor blade. This is homogeneously formed as a solid material, for example made of an elastomer or a metal having a suitable modulus of elasticity. The doctor blade 107 is flexible and elastic to be able to compensate for local unevenness on the surface 125.

In addition, the doctor blade 107 is rotatably mounted along the direction 109 relative to the carrier 103. The doctor blade 107 is rotatable about a main axis 127. Alternatively or additionally, the doctor blade 107 is rotatable about another main axis 128. The main axis 127 and the main axis 128 are perpendicular to each other. The main axis 128 corresponds, for example, to a longitudinal direction of the doctor blade 107 along which the doctor blade 107 comprises its greatest extent. Thus, deviations of the surface 125 of the wafer assemblage 102 from a horizontal 120 along the displacement direction 121 can be reliably compensated. For example, a distance of the doctor blade 107 to the surface 125 of the wafer assemblage 102 along the displacement direction 121 remains the same even if a distance of the doctor blade 107 to the carrier 103 changes along the displacement direction 121. Thus, the compressive forces of the doctor blade 107 on the wafer assemblage 102 can be kept constant. A flexibility of the doctor blade 107 also contributes to this.

According to exemplary embodiments, the carrier 103 comprises a frame 118. The frame 118 comprises the same height 119 along the direction 109 as the wafer assemblage 102, within predetermined tolerances. The frame 118 is adapted to an outer contour 124 of the wafer assemblage 102, for example, to a round or polygonal outer contour 124 of the wafer assemblage 102. The frame 118 absorbs compressive forces of the doctor blade 107. Thus, a varying length of the wafer assemblage 102 in the area 108 along the displacement direction 121 is compensated for in order to always be able to apply a constant pressure to the wafer assemblage 102 within predetermined tolerances. When the width of the wafer assemblage 102 is small, more pressure is applied to the frame 118 along the contact line 108 than when the width of the wafer assemblage 102 is large.

FIGS. 3 and 4 illustrate the device 100 according to another exemplary embodiment. The device 100 is substantially similar to the exemplary embodiment as explained in connection with FIGS. 1 and 2. In the following, priority will be given to the differences between the exemplary embodiment of FIGS. 3 and 4 and the exemplary embodiment of FIGS. 1 and 2. Combinations of individual elements of the various exemplary embodiments are also possible. For example, the doctor blade 107 as described in connection with FIGS. 3 and 4 can also be used in the exemplary embodiment as described in connection with FIGS. 1 and 2, and vice versa. In addition, for example, the different embodiments of the film 105 are usable in the different devices 100.

The film 105 according to the exemplary embodiment of FIGS. 3 and 4 comprises only the electrically conductive polymer film 111. An additional electrically conductive layer such as the metal layer 112 is omitted. The polymer film 111 serves in particular to limit the current flow in the event of a short circuit.

The voltage source 110 is directly coupled to the doctor blade 107. The doctor blade 107 is formed of an electrically conductive material, such as an elastic metal sheet. In the exemplary embodiment shown, the doctor blade 107 is formed as a comb doctor blade 114. It is also possible to connect another embodiment of the doctor blade 107 directly to the voltage source 107, for example a doctor blade 107 made of solid material as described in connection with FIGS. 1 and 2.

The comb doctor blade 114 comprises a plurality of prongs 115, between each of which is a slot 126. For example, the slots 126 are brought into a metal sheet at a spacing depending on the pattern of the semiconductor chips 101 of the wafer assemblage 102. For example, the slots 126 each comprise a distance of about 100 μm from each other. As a result, prongs 115 are formed for exerting the compressive force along the direction 109 and for making electrical contact. The prongs 115 are also elastic and flexible enough to reliably compensate for local unevenness on the surface 125. In particular, the width of the individual prongs 115 is in the range of the width of the individual semiconductor chips 101. In the region 108 where the doctor blade 107 presses the film 105 against the front contacts 106 of the semiconductor chips 101, a voltage is applied between the doctor blade 107 through the film 105 and the carrier 103.

It is also possible to provide the metal layer 112 in addition to the polymer film 111, even if the voltage source 110 is directly connected to the doctor blade 107. The metal layer 112 then serves in particular to absorb tangential forces generated by the doctor blade during the method along the displacement direction 112. The polymer film 111, which serves as a resistance film, is then subjected only to vertical forces.

FIG. 5 shows the doctor blade 107 according to an exemplary embodiment. The doctor blade comprises a holder 129. By means of the holder 129, the doctor blade 107 is fixed, for example to a suspension of the device 100. The holder 129 has, for example, an electrically insulating effect. The holder 129 is, for example, made of a plastic. The holder 129 comprises, for example, a fiber-plastic composite or is made of a fiber-plastic composite, also called a hard fabric.

To apply pressure to the film 105, the doctor blade 107 comprises a sheet of the doctor blade 130. The sheet of the doctor blade 130 is in direct contact with the film 105 during operation. The sheet of the doctor blade 130 is fixed to the holder 129 by means of a fastening 131. The fastening 131 comprises, for example, one or more screws.

In the exemplary embodiment according to FIG. 5, the sheet of the doctor blade 130 comprises a first sub-sheet 132 and a second sub-sheet 133. The two sub-sheet 132, 133 are, for example, each made of a metal, for example a steel.

The first sub-sheet 132 is in contact with the holder 129, for example, and the first sub-sheet 132 is arranged between the holder 129 and the second sub-sheet 133. The first sub-sheet 132 is formed thicker than the second sub-sheet 133. For example, the first sub-sheet 132 comprises a thickness between 2 and 5 mm, for example 3 mm.

The second sub-sheet 133 is used to apply pressure to the film 105. In operation, the second sub-sheet 133 is in direct contact with the film 105. The second sub-sheet 133 is thinner than the first sub-sheet 132. For example, the second sub-sheet 133 comprises a thickness between 100 μm and 200 µm, for example 150 µm. For example, the second sub-sheet 133 is designed in the manner of a Hasberg film.

The second sub-sheet 133 comprises a protrusion 137. The protrusion 137 projects beyond the first sub-sheet 132. By means of the protrusion 137 of the second sub-sheet 133, a flexible region of the sheet of the doctor blade 130 is formed. In addition, the imprint area of the sheet of the doctor blade 130 on the film 150 is reduced compared to the overall thickness of the sheet of the doctor blade 130.

FIG. 6 shows the doctor blade 107 according to an exemplary embodiment. The holder 129 and the fastening 131 are formed, for example, corresponding to the exemplary embodiment according to FIG. 5. In contrast to the exemplary embodiment of FIG. 5, the sheet of the doctor blade 130 according to FIG. 6 comprises a laminate 134.

The laminate 134 is a composite of layers of different materials, for example at least two different materials 135, 136. For example, a layer of the second material 136 is laminated between two layers of the first material 135. For example, the first material 135 is softer than the second material 136. For example, the second material 136 is harder than the first material 135. For example, the two materials 135 and 136 are each plastics, a plastic and a metal, or other combinations of materials.

The softer first material 135 enables flexibility and elasticity of the sheet of the doctor blade 130. The harder second material 136, which protrudes over the first material 135 at the protrusion 137, enables the film 105 to be pressed onto the wafer assemblage 102 with sufficient firmness and precision. For this purpose, a tip is formed on the second material 136, for example.

The sheet of the doctor blade 130 is attached to the holder 129 such that the sheet of the doctor blade 130 is formed inclined relative to the direction 109. The holder 129 is designed such that the sheet of the doctor blade 130 comprises the inclination relative to the direction 109.

Thus, relative movement between the tip of the sheet of the doctor blade 130 and the carrier 102 and/or the holder 129 is facilitated.

By means of the device 100, in the different exemplary embodiments and also in the possible combinations of the individual elements of the device 100, a simple contacting of only a part of the semiconductor chips 101 in the wafer assemblage 102 is possible, since the doctor blade 107 predetermines that contacting is always made only along the line 116. The suspension of the doctor blade 107, which enables a tilting movement about the main axis 127 along the direction 107, ensures in particular that a skewed position of the wafer assemblage 102 can be compensated, in particular a so-called automatic wedge error compensation. A tilting movement about the main axis 128 and/or the flexibility of the doctor blade 107 also contribute to this, for example due to the material of the doctor blade 107 such as rubber or the design as a comb doctor blade 115.

The film 105, in particular the polymeric film enables the compensation of local unevenness on the surface 125, thus eliminating the need for an additional compensating film that otherwise compensates for local unevenness on the surface 125. In particular, the comb doctor blade 114 is additionally useful because the contact pressure on the wafer assemblage 102 always remains the same, regardless of the location of the doctor blade on the wafer assemblage. Even at the beginning of the processing, when the wafer assemblage 102 comprises a small width and the contact line is correspondingly short, it is realized by means of the prongs 115 that the entire force of the doctor blade 107 is not exerted and an excessively high contact pressure is generated. This is also achieved by means of the use of the frame 128. Due to the line-shaped contacting, the maximum current occurring during operation is significantly lower than, for example, with conventional full-area contacting and can be limited, for example, to less than 2 A depending on the number of semiconductor chips 102 which are contacted simultaneously.

The front contacts 106 are contacted in the areas 108 on a side of the wafer assemblage 102 facing away from the carrier 103, and are not contacted in the unpowered areas 123. A sufficiently high voltage is applied between the film 105 and/or the doctor blade 107 and the carrier 103 in the reverse direction of the semiconductor chips 101 that reverse-weak semiconductor chips 101 are damaged. Then, for example, processing of the semiconductor chips 101 of the wafer composite 102 is performed depending on a luminous image generated by emitted radiation caused by the semiconductor chips 101. In this case, the radiation-emitting semiconductor chips 101 are classified as intact, for example.

In particular, reverse-weak semiconductor chips are those semiconductor chips 101 that comprise an actual breakdown voltage that deviates significantly from a predetermined target breakdown voltage. In other words, in the case of reverse-weak semiconductor chips, current flow through the corresponding semiconductor chips 101 in the breakdown region of the semiconductor chip is already achieved when a voltage lower in magnitude than the predetermined target breakdown voltage is applied. Current flow through the semiconductor chips 101 under such conditions generally results in the formation of a so-called shunt path in the semiconductor chip. Thus, the emission of electromagnetic radiation during operation is either absent or occurs only to a greatly reduced extent.

The device 100 with the line-shaped contacting of the semiconductor chips 101 by means of the doctor blade 107 makes it possible to measure the chips 101 of the wafer assemblage 102 quickly and inexpensively.

The invention is not limited to the exemplary embodiments by the description thereof. Rather, the invention encompasses any new feature as well as any combination of features, which particularly includes any combination of features in the claims, even if that feature or combination itself is not explicitly specified in the claims or exemplary embodiments. This refers, for example, to the different embodiments and contacting of the doctor blade and the film, which can be combined as desired.

LIST OF REFERENCE SIGNS 100 device
101 semiconductor chip
102 wafer assemblage
103 carrier
104 rear contact
105 film
106 front contact
107 doctor blade
108 region
109 direction
110 voltage source
111 polymer film
112 metal layer
113 heater
114 comb doctor blade
115 prongs
116 line 117 tensioning frame
118 frame
119 height
120 horizontal
121 displacement direction
122 tensioning device
123 unpowered area
124 outer contour
125 surface
126 slot
127, 128 main axis
129 holder
130 sheet of the doctor blade
131 fastening
132, 133 sub-sheet
134 laminate
135, 136 material
137 protrusion

The invention claimed is:

1. A device for processing a plurality of semiconductor chips in a wafer assemblage, the device comprising:
   an electrically conductive carrier for contacting rear contacts of the semiconductor chips,
   an electrically conductive film for contacting front contacts of the semiconductor chips, which are opposite to the rear contacts, and
   a doctor blade displaceable relative to the film and designed to press a portion of the film toward the carrier.

2. The device according to claim 1, comprising an electrical voltage source,
   electrically connected to the carrier, and
   electrically connected to the doctor blade and/or the film.

3. The device according to claim 1, wherein the film comprises an electrically conductive polymer film.

4. The device according to claim 1, wherein the film comprises an electrically conductive metal layer.

5. The device according to claim 1, wherein the film is coupled to a heater to heat the film.

6. The device according to claim 1, wherein the doctor blade is a comb doctor blade comprising a plurality of prongs.

7. The device according to claim 1, wherein the doctor blade is rotatably mounted relative to the carrier about a main axis of the doctor blade.

8. The device according to claim 1, wherein the doctor blade is designed to contact, by means of the film, the semiconductor chips along a line, wherein the semiconductor chips are unpowered outside the line.

9. The device according to claim 1, wherein the carrier comprises a frame adapted to an outer contour of the wafer assemblage and comprises a same height as the wafer assemblage to accommodate compressive forces of the doctor blade outside the wafer assemblage.

10. The device according to claim 1, wherein the doctor blade comprises a holder for mounting the doctor blade and an element for contacting the film, wherein the element comprises at least one of:
    a doctor blade comprising a metal,
    a doctor blade comprising a plastic,
    a doctor blade comprising a rubber, and
    a laminate comprising at least two different materials.

11. A method of processing a plurality of semiconductor chips in a wafer assemblage, the method comprising:
    electrically contacting rear contacts of the semiconductor chips,
    pressing a region of an electrically conductive film against a portion of front contacts of the semiconductor chips opposite to the rear contacts, thereby electrically contacting the portion of the front, contacts, and
    moving the portion of the film.

12. The method according to claim 11, comprising:
    applying an electrical voltage to the film.

13. The method according to claim 11, comprising:
    heating the film.

14. The method according to claim 11, comprising:
    pressing the area of the film against the part of the front contacts by means of a doctor blade.

15. The method according to claim 14, comprising:
    moving the doctor blade relative to the wafer assemblage along the semiconductor chips, and
    moving the region of the film.

* * * * *